United States Patent
Steinhardt et al.

(10) Patent No.: US 6,706,141 B1
(45) Date of Patent: Mar. 16, 2004

(54) DEVICE TO GENERATE EXCITED/IONIZED PARTICLES IN A PLASMA

(75) Inventors: Heinz Steinhardt, Kottingbrunn (AT); Alexander Gschwandtner, München (DE); Josef Mathuni, München (DE)

(73) Assignee: R3T Rapid Reactive Radicals Technology, Munich (DE)

( * ) Notice: Subject to any disclaimer, the term of this patent is extended or adjusted under 35 U.S.C. 154(b) by 0 days.

(21) Appl. No.: 09/625,200

(22) Filed: Jul. 21, 2000

Related U.S. Application Data

(63) Continuation of application No. PCT/EP99/07617, filed on Oct. 11, 1999.

(30) Foreign Application Priority Data

Oct. 16, 1998 (DE) .......................... 198 47 848

(51) Int. Cl.$^7$ ..................... H05H 1/00; C23C 16/00; H01J 21/00
(52) U.S. Cl. ............. 156/345.41; 156/345.42; 118/723 ME; 118/723 MR; 118/723 ER; 315/111.21
(58) Field of Search ............. 156/345.41–345.42; 118/723 ME, 723 MR, 723 ER, 723 MW, 723 E, 723 MA; 315/111.21, 111.71, 111.41, 111.31

(56) References Cited

U.S. PATENT DOCUMENTS

| | | | | |
|---|---|---|---|---|
| 4,434,742 A | * | 3/1984 | Heaff et al. | 118/723 I |
| 4,543,465 A | * | 9/1985 | Sakudo et al. | 219/121.4 |
| 5,356,672 A | * | 10/1994 | Schmitt, III et al. | 427/446 |
| 5,368,897 A | * | 11/1994 | Kurihara et al. | 427/450 |
| 5,560,779 A | * | 10/1996 | Knowles et al. | 118/723 MP |
| 5,734,143 A | * | 3/1998 | Kawase et al. | 219/121.43 |
| 5,961,772 A | * | 10/1999 | Selwyn | 156/345 |
| 6,057,645 A | * | 5/2000 | Srivastava et al. | 315/111.21 |
| 6,187,072 B1 | * | 2/2001 | Cheung et al. | 55/186 |

FOREIGN PATENT DOCUMENTS

| | | | |
|---|---|---|---|
| DE | 1902307 | * 10/1969 | H05H/1/00 |
| DE | 3905303 C2 | 8/1989 | |
| DE | 3915477 A1 | 11/1989 | |
| DE | 4004560 A1 | 8/1990 | |
| DE | 4028525 A1 | 3/1991 | |
| DE | 4132558 C1 | 12/1992 | |
| DE | 19608949 A1 | 9/1997 | |
| JP | 9-115686 A | * 5/1997 | H05H/1/02 |

* cited by examiner

*Primary Examiner*—Parviz Hassanzadeh
(74) *Attorney, Agent, or Firm*—Baker & Hostetler LLP

(57) ABSTRACT

A device to generate excited and/or ionized particles in plasma with a generator to generate an electromagnetic wave and at least one plasma zone, in which the excited and/or ionized particles are formed by the electromagnetic wave. The plasma zone is formed in an interior chamber of a conductor for the electromagnetic wave.

16 Claims, 4 Drawing Sheets

DEVICE TO GENERATE EXCITED/IONIZED PARTICLES IN A PLASMA

RELATED APPLICATIONS

Figure 1:
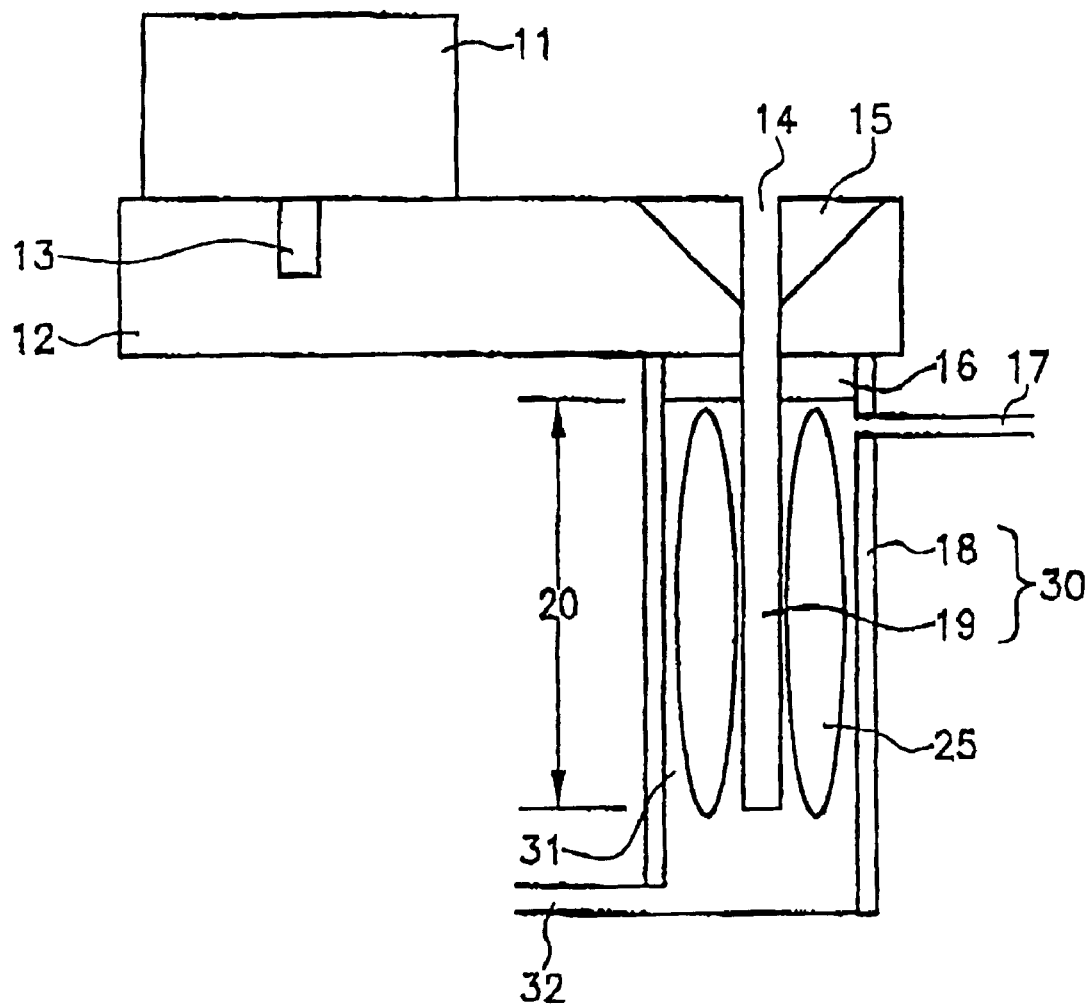

This application is a continuation of International Application No. PCT/EP99/07617, filed Oct. 11, 1999, which claims priority from German Application No. 19847848.8, filed Oct. 16, 1998, both of which are incorporated herein by reference.

The present invention pertains to a device to generate excited or ionized particles in a plasma.

Integrated circuits, in particular memory components or microprocessors, are produced in a number of process steps. The manufacturing costs for these circuits are governed by the process complexity and the physical processing time. Highly complex components frequently require several hundred individual process steps and a number of days for the product to pass through the process.

A portion of the process steps is dedicated to the specific application and the specific removal of material to or from the semiconductor surface. The etching or deposition techniques used for this, in addition to the lithography and the doping methods, are fundamental processes that are used repeatedly in the set of process steps to manufacture the highly integrated circuits (in general, see "Technologie hochintegrierter Schaltungen," [Technology of highly integrated circuits], D. Widmann, H. Mader, H. Friedrich, Springer Pub., 1988, in particular, sections 3.1.1 and 5.2.2–4).

An important method for deposition of material onto the surface of a semiconductor is the chemical gas-phase deposition method, also called the CVD-method (chemical vapor deposition). In this method, selected process gases are fed over the heated semiconductor substrates onto which the desired layer is to be deposited. The result is a reaction of the process gas on the hot substrate surface, so that as reaction product, first the desired layer is produced, and second, other reaction gases are generated which are vented from the reactor. Now for a number of reasons it may be undesirable to heat the semiconductor substrate up to the high temperature required for the completion of the chemical reaction. Therefore, today it is often standard practice to implement an excitation of the initial reaction gases to create dissociated, highly reactive components and to initiate the deposition reaction not primarily by an increase in the temperature of the semiconductor substrate, but rather by a plasma or by high-energy radiation.

To produce an integrated circuit, however, it is not sufficient to apply material coatings only on one semiconductor substrate. To generate the desired structures, parts of these layers must be specifically removed again. In this case, a number of methods can be employed, and dry chemical etching and dry chemical-physical etching are the most frequently used methods. Now in dry chemical etching a chemical reaction takes place between the particles of a gas and the atoms of the surface to be etched. In chemical-physical dry etching, the chemical reaction occurs between the particles of a gas and the atoms of the surface to be etched, by means of an additional exposure of the etch surface to ions, electrons or photons. And again, for a number of reasons it may be undesirable to heat the semiconductor substrate to the high temperature needed for the completion of the chemical reaction. Therefore, in dry chemical or dry chemical-physical etching it is standard practice to cause an excitation of the reaction gases into dissociated, highly reactive components and to initiate the etching reaction by a plasma.

For successful implementation of this kind of etching and deposition process it is important to generate high-energy and therefore highly reactive, neutral particles, in particular, radicals, with a sufficiently high efficiency. The technical solution to this problem is being increasingly linked with the simultaneous need to satisfy the additional requirements for prevention of the influence of electric fields and charged particles on the process substrate, and for the broadest possible operating pressure range for the etching and deposition processes.

Usually high-frequency discharges are used to generate highly reactive, neutral particles. A system of this kind is shown, for example, in FIG. 4, which is described in the sales brochure "Model CDE-VIII Microwave Downstream Etching System," Specification #840008, Apr. 1, 1986 Revision 2, by TYLAN/TOKUDA, USA. This document presents schematically a known, commercial downstream etching system with microwave excitation.

Figure 4:
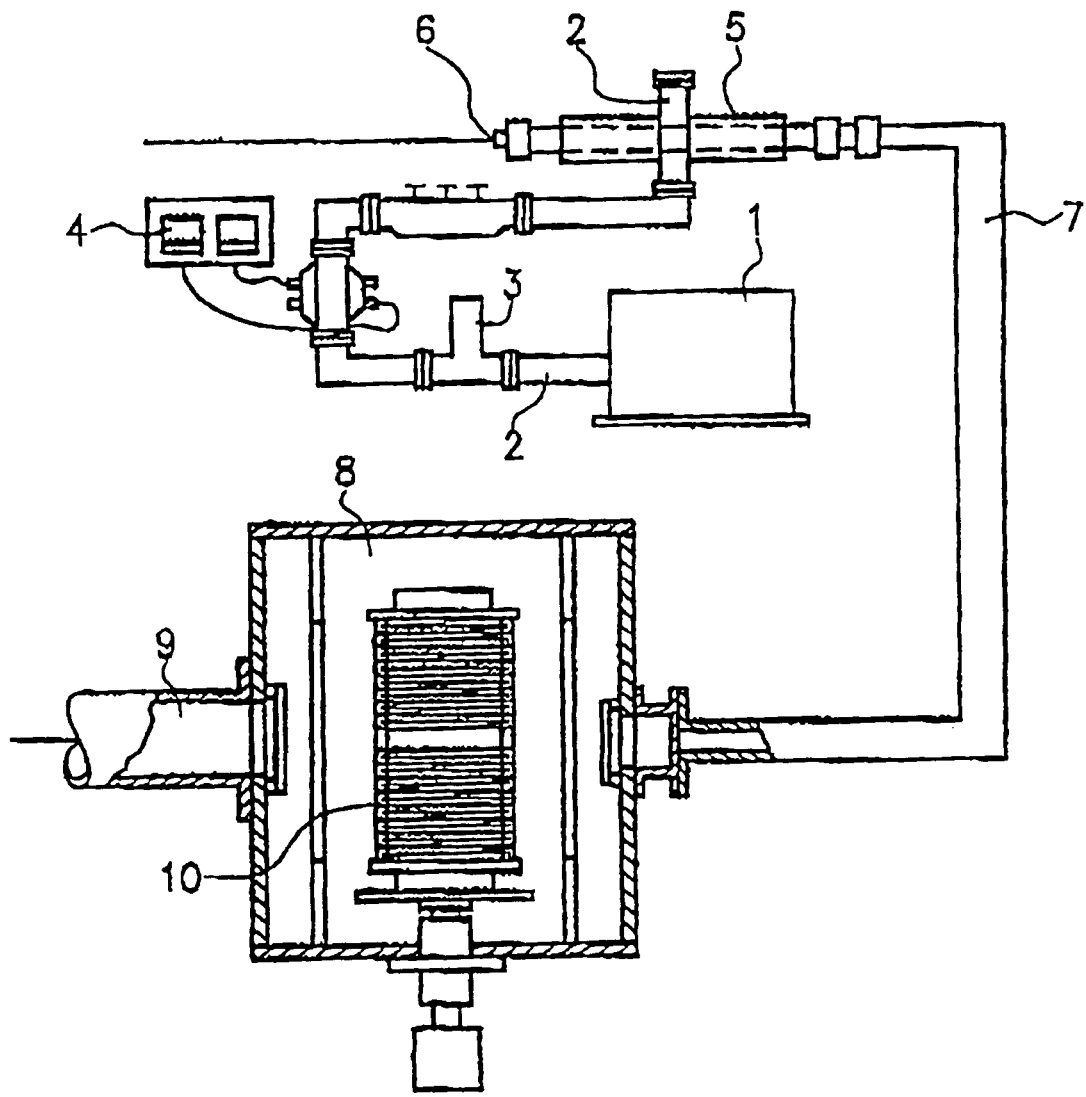

FIG. 4 presents a microwave generator 1 which produces microwaves which are injected into a hollow waveguide system 2. By means of a tuning unit 4 and due to the dimensioning of the hollow waveguide system 2, a standing wave will form through which the microwave energy is concentrated at defined sites of the hollow waveguide system 2. The non-tuned, reflected and non-converted energy must be absorbed somewhere in the hollow waveguide system 2, for example, in the T-piece 3 or at the end of the hollow waveguide 2, which usually takes place by means of a water load. To generate radicals by means of microwave energy, a plasma discharge tube 5—which is aligned in the direction of the electric field of the standing wave—is passed through the hollow waveguide system 2. If suitable process gases are sent to the input 6 of the plasma discharge tube 5 and the plasma is ignited, then stimulated, neutral particles are produced, plus other particles. These neutral particles are then transported by means of a supply line 7, which is about 1 m long, to the etching reaction/reaction chamber 8.

Thus, excited, neutral particles move to the surface of substrate wafers 10 attached to a rotary table, where they trigger the desired etching reactions. The reaction chamber 8 is evacuated by a pump 9 and the volatile reaction products are vacuumed off.

For a smooth operation of the device, the plasma discharge tube must be manufactured from a material that hardly absorbs microwaves and which is resistant to the chemically aggressive radicals generated in the plasma. In this regard, as a rule, metal oxides or quartz is used. However, these materials are severely attacked by reducing gases, such as hydrogen, in the plasma zone, so that conducting islands can be created in the surfaces of these materials, which, in turn, leads to an increased absorption of the microwave energy.

The problem with this kind of downstream etching system is the tuning of the standing wave. The standing wave must be tuned so that exactly one voltage maximum will be available to the plasma discharge. Even minor faults in tuning will result in significant changes in the process parameters, which in turn can result in an overload of the microwave generator. This overloading of the microwave generator can be prevented, of course, with complicated and high-cost means. However, these activities reduce the efficiency and in addition, result in a definite increase in the size of the entire device. Due to the size of the device, these systems are very difficult to integrate into semiconductor production facilities. If it is necessary to replace worn parts, such as the microwave generator or plasma discharge tube, then the entire device has to be retuned.

In spite of an accurate tuning, however, a significant portion of the energy is not converted into stimulating energy, but rather is reflected and has to be absorbed in the hollow waveguide, usually in a water load, in order not to damage the microwave generator, for example, a magnetron. This partial conversion of the available microwave energy proves to be troublesome, in particular in light of the requirement already mentioned above for a broad operating pressure range, since precisely the low pressure range below about 13, especially below 1.3 Pa, is of interest to and is an advantage for semiconductor engineering. Low pressures, for example, are important to surface-controlled CVD processes to avoid depositions with undesirable layering properties. Also, in etching processes, a high etching rate and the prevention of microload effects—that is a local etching rate dependent on the environment—can often only be obtained at very low pressures. However, ignition difficulties occur in the plasma discharge even in the pressure range below 13 Pa, since the excitation density and thus also the efficiency of generation decrease too much.

A device similar to that of the invention to generate excited and/or ionized particles in a plasma from a process gas, is described in DE 39 05 303 A1. The device disclosed therein features a generator to produce an electromagnetic wave, a coaxial conductor in which the electromagnetic wave is guided, and at least one plasma zone in which the excited and/or ionized particles are formed by the electromagnetic wave. The plasma zone in the device according to DE 39 05 303 A1 is provided in an isolated discharge tube, which is located at least in part within the inner conductor of a coaxial waveguide. In this regard, an electrical microwave field is generated outside of the discharge tube in a region between the inner conductor shortened against the outer conductor, and an end plate sealing off the outer conductor.

Additional devices to generate excited and/or ionized particles in a plasma are disclosed in DE 39 15 477 A1, DE 40 04 560 A1 and also DE 40 28 525 A1. Again, a plasma is created in the devices described therein, again using a discharge tube which is located within the inner conductor of a coaxial waveguide.

A device to generate high-performance microwave plasmas is also known from DE 196 08 949 A1. In this case, the resonator is likewise formed as a coaxial resonator with inner and outer conductor. The plasma is created in a plasma chamber which is surrounded by the inner conductor or which encloses the outer conductor.

Also, in DE 41 32 558 C1 a method and a device are known to generate excited, neutral particles by means of a plasma discharge powered by microwave energy. In this case, a plasma discharge tube whose diameter corresponds to one-quarter wavelength of the standing microwave, is positioned perpendicular to a hollow waveguide system. A transversal-electrical microwave mode is excited by an associated generator in the hollow waveguide system.

Furthermore, it is known how to stabilize the plasma by enveloping it in a magnetic field whose cyclotron frequency is in resonance with the frequency of the microwaves (ECR-method), also in the pressure range below $13 \times 10^{-2}$ Pa. However, even with methods of this kind, stimulated neutral particles will not be available in sufficient numbers and density. This is not surprising under consideration of the fact that only about 30% of the microwave energy is converted into the discharge even in an improved ECR-method.

Therefore, it is the purpose of the present invention to provide a device that decreases or prevents the stated disadvantages of the state of the art. In particular, it is the purpose of the invention to specify a device that features a sufficiently high efficiency even in the pressure range below about 13 Pa and which provides a sufficient quantity of excited/ionized particles.

This problem is solved by the device according to claim 1. Additional favorable design formats, configurations and aspects of the present invention are indicated in the subclaims of the description and in the associated figures.

According to the invention, a device is described to generate excited and/or ionized particles in a plasma from a process gas with a generator to generate an electromagnetic wave, a coaxial conductor in which the electromagnetic wave is guided, and at least one plasma zone in which the excited and/or ionized particles are formed by the electromagnetic wave. The device according to this invention is characterized in that an inlet of the process gas into an interior chamber of the coaxial conductor is located between an outer conductor and an inner conductor, and that the inner chamber forms the plasma zone.

The invented device essentially needs no tuning, since no resonance conditions have to be observed and no standing wave with a voltage maximum at a particular site need be available for generation of the plasma. The plasma zone is located at one site of the coaxial conductor at which normally the dielectric is found in a coaxial conductor. The plasma in the plasma zone thus represents a "high-loss dielectric" which is described in the replacement circuit diagram with an ohmic coefficient.

The energy of the electromagnetic wave is thus converted directly at a high efficiency into a high-density plasma. Due to the ohmic load, the electromagnetic wave experiences a high attenuation, so that tuning of the device is superfluous.

In other words, the plasma discharge occurring in the plasma zone damps the system and makes it broad-band.

Thus, in the invented device the complicated tuning units and also an additional water load can be omitted. The invented device thus makes possible a very small and compact design which can be easily integrated into existing production or laboratory installations. In addition, maintenance of the invented device is significantly simplified, so that maintenance costs will be reduced.

The coaxial conductor features an inner conductor and an outer conductor. Since the impedance of a coaxial conductor is defined by the outer diameter of the inner conductor, the inner diameter of the outer conductor and the dielectric constant of the medium between inner and outer conductor, the adjustment of the device is especially easy.

Preferably the generator to generate the electromagnetic wave is a magnetron and thus a microwave excitation can be used.

The device according to this invention has the advantage that the outer conductor and/or the inner conductor is manufactured from metal, preferably from aluminum. The use of metal in the plasma zone makes it possible by simple means to use reducing gases, such as hydrogen.

In the case of process gases that attack the used metal, it is preferred to use metal coated with oxide or quartz or metallized oxide or quartz tubes.

In addition, the invented device features the advantage that the inner conductor and/or the outer conductor of the coaxial conductor is cooled. In particular, it is preferred for the inner conductor and/or the outer conductor of the coaxial conductor to be cooled by means of water cooling. Due to the cooling, the walls contacted by the plasma can be kept at a controlled, low temperature. Thus, firstly, the material wear of the components and the contamination and particle loading resulting therefrom are reduced significantly. And secondly, the reducing effect of reducing gases at the walls contacted by the plasma will be reduced considerably.

In addition, it is preferred that the electromagnetic wave is guided by means of an impedance converter into the coaxial conductor. The generator of the electromagnetic wave thus heed not itself be adjusted to the coaxial conductor, so that a greater selection of generators will be available. The impedance converter can be a hollow waveguide and impedance transformer cone, for example.

In addition, overall it is preferable to provide a magnetic system for the invented device. Due to the use of a magnetic system, process pressures of less than 1 Pa are possible. Preferably the magnetic system is composed of one or more magnetic field coils and magnetic rings at the outside of the outer conductor. Thus, the magnetic rings can even be replaced by pole shoe rings. In addition, in the inner conductor, rod pole shoes or rod magnets are preferred which can be used for local field amplification and correction of the field profile.

In addition, it is possible to provide a transport region between the generator for the electromagnetic wave or the impedance converter and the plasma zone, in which the electromagnetic wave is transported essentially without loss. Due to the use of a transport region, during operation of the invented device additional freedom of operation is obtained. The plasma zone and the generator for the electromagnetic wave need not be located directly neighboring each other, but rather can be placed spatially separate from each other. In this case it is highly preferred to design the transport region as a coaxial conductor.

In addition, it is preferred to provide a sensor system to monitor the plasma in the plasma zone. For example, if there happens to be an error in the ignition of the plasma, this can be found by the sensor system and the generator can be shut off. Damage to the generator by the reflected wave can thus be prevented.

Figure 2:
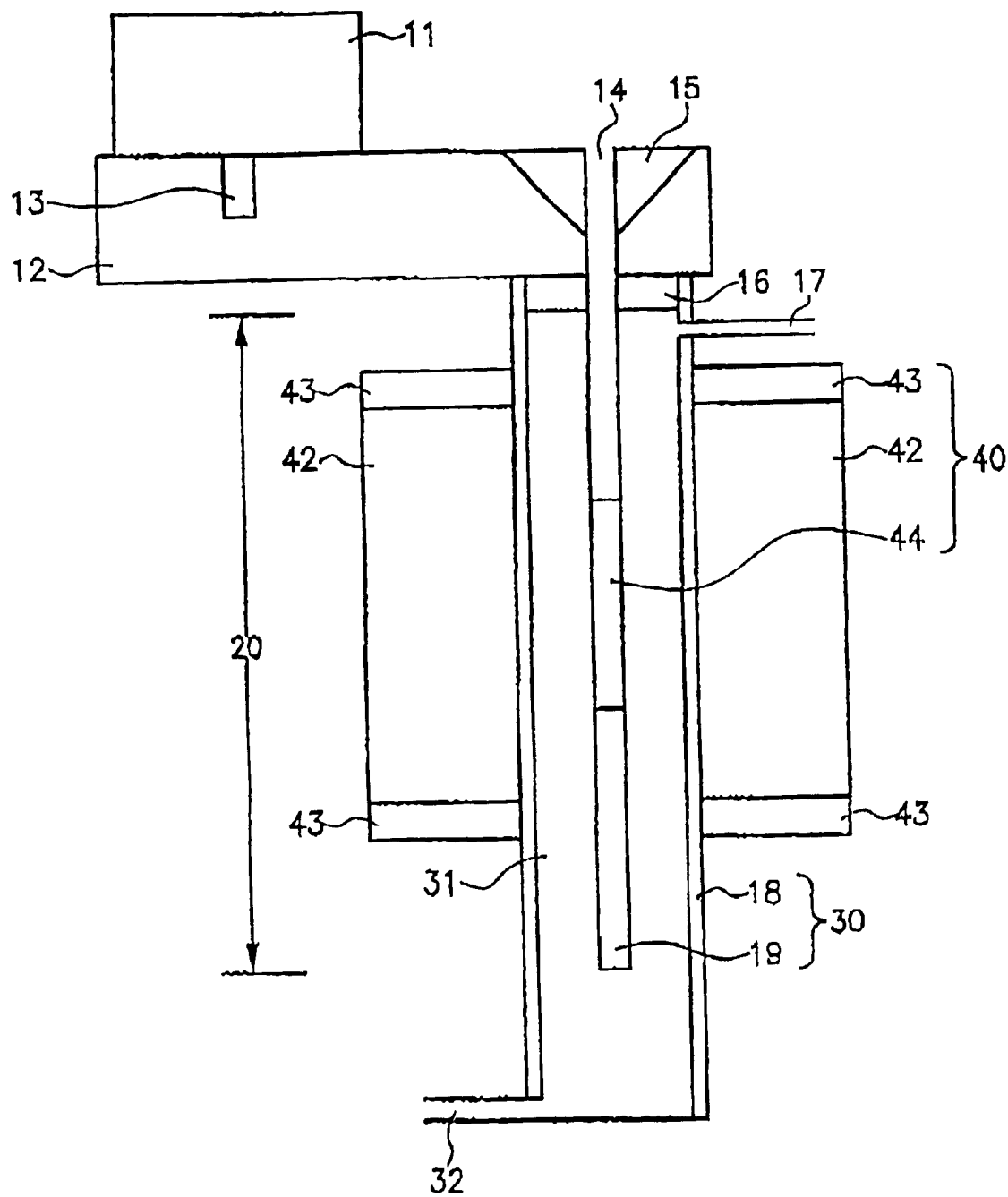
Figure 3:
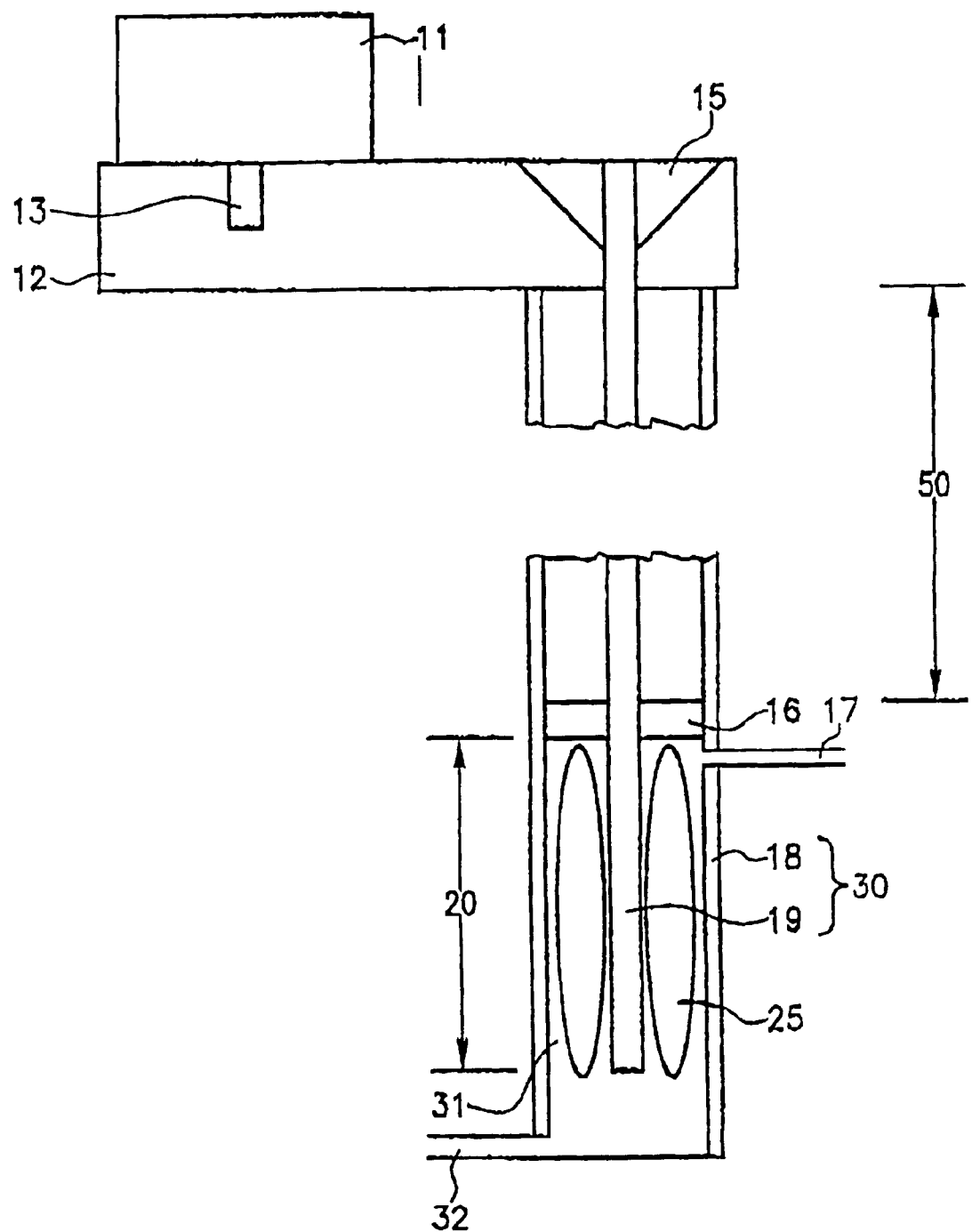

The invention will now be explained in greater detail based on the figures and the attached drawings. We have:

FIG. 1 A schematic illustration of a first design example of the invented device FIG. 2 A schematic illustration of a second design example of the invented device FIG. 3 A schematic illustration of a third design example of the invented device FIG. 4 A schematic illustration of a state-of-the-art device to generate excited particles.

FIG. 1 shows a schematic illustration of a first design example of the invented device. In this figure, reference number 11 denotes a generator to generate an electromagnetic wave. In this design format, the generator 11 is a magnetron that generates microwaves. The microwave is injected into a hollow waveguide 12 by means of a signal injection pin 13. In the vicinity of the end of the hollow waveguide 12 located opposite the injection pin 13 there is an impedance transformer cone 15 which is used to guide the microwave into a coaxial conductor 30. The hollow waveguide 12 and the impedance transformer cone 15 thus act like an impedance converter, so that the microwave can be guided mostly without reflections into the coaxial conductor 30.

The coaxial conductor 30 in this case is composed of the outer conductor 18 and the inner conductor 09, between them the plasma zone 20 is formed in the inner chamber 31 of the coaxial conductor 30. By means of an inlet 17, the process gas is fed into the inner chamber 31 of the coaxial conductor 30. In order to prevent process gas from getting into the hollow waveguide 12, a seal 16 is provided that separates the hollow waveguide 12 from the inner chamber 31. The length of the plasma zone 20 and thus the plasma density will be determined by the length of the inner conductor 19.

In order to be able to adjust the length of the plasma zone 20 and the density of the plasma 25 to differing requirements, the inner conductor 19 is displaceable. The impedance of the coaxial conductor 30 is governed by the outer diameter of the inner conductor 19, the inner diameter of the outer conductor 18 and the dielectric constant of the medium between the inner and outer conductor. Since the impedance of the coaxial conductor 30 does not depend on the length of the inner conductor 19, the length of the plasma zone 20 can be changed without changing the impedance of the coaxial conductor 30.

Due to the interaction of the process gas with the microwave, there is a plasma discharge in the plasma zone 20, so that excited and/or ionized particles are produced. After leaving the plasma zone 20, the excited and/or ionized particles are guided through an outlet 32 to a reaction chamber (not shown) in which the excited and/or ionized particles are used for additional reactions.

Depending on the application, the invented device can be designed so that essentially only excited particles, for example, and no ionized ones leave the plasma zone 20. This is important in particular when the excited particles are being used for etching and deposition processes. Thus, any exposure of the treated substrate to ionized particles can be avoided.

The outer conductor 18 and the inner conductor 19 can be manufactured from metal, preferably from aluminum. The use of metal in the plasma zone makes it possible, by simple means, to use reducing gases, such as hydrogen.

With regard to process gases that attack the used metal, it is preferable to use a metal coated by oxide or by quartz, or metallized oxide or quartz tube. The invented device has the advantage that the coaxial conductor 30 can be cooled with water. In this case, a water inlet 14 for the inner conductor 19 is located in the impedance transformer cone 15. The outer conductor 18 is likewise water-cooled. Water cooling can be used with the invented device because the water is in no case exposed to the microwave energy, even though it flows in parallel with the plasma zone 20. Due to the water cooling, the walls contacted by the plasma 25 can be kept to a low, controlled temperature. Thus, in the first place, the material wear on the components and the resultant contamination and particle loading will be greatly reduced. In the second place, the reducing effect of reducing gases on the walls contacted by the plasma will be greatly reduced. At the same time, the generation of the excited and/or ionized particles will be improved.

FIG. 2 shows a schematic illustration of a second design embodiment of the invented device. In this case, the same components are identified by the same reference symbols as in FIG. 1.

To expand the applications of the invented device, a magnet system 40 is provided in the design format shown in FIG. 2. The magnet system 40 is composed of a magnetic field coil 42 and magnet rings 43 at the outside of the outer conductor 18 at the level of the plasma zone 20. In this case, the magnet rings 43 can be replaced by pole shoe rings. Furthermore, in the inner conductor 19 there are rod pole shoes or rod magnets 44 which can be used for local field amplification and correction of the field profile.

These measures allow process pressures of less than 1 Pa The combination of magnetic coil and permanent magnet reduces the energy requirement of the magnet system and at the same time, increases the efficiency.

FIG. 3 shows a schematic illustration of a third design format of the invented device. In this case, once again the same components have the same reference symbols as in FIG. 1.

The design format of the invented device shown in FIG. 3 is characterized in that between the hollow waveguide 12 and the plasma zone 20, there is an additional transport region 50 which guides the microwave from the hollow waveguide 12 to the plasma zone 20. The transport range 50 is likewise designed as a coaxial conductor.

Due to the use of a transport region 50, the operation of the invented device will also allow additional flexibility in operation. The generator 11 of the electromagnetic wave and the plasma zone 20 can now be set up spatially separate from each other, if this is an advantage due to the particular conditions of a specific application. Since the microwave can be guided along a coaxial conductor with virtually no loss, the efficiency of the invented device will not be changed by this factor.

The invented device features a high efficiency and can thus provide a large quantity of excited/ionized particles. As one sample application, we can consider the etching of a silicon surface with excited fluorine atoms. At a pressure of 100 Pa, $NF_3$ molecules with a flow of 200 sccm are directed into a device according to this invention. Due to the plasma discharge in the plasma zone 20, excited fluorine atoms F* are produced that are guided to a silicon surface. On the silicon surface there is a reaction of the silicon atoms with the excited fluorine atoms, so that volatile $SiF_4$ is produced. Due to the use of the invented device, an etching rate of about 5 µm/min can be achieved. From this etching rate one can conclude that the fluorine atoms present in the $NF_3$ molecules are used at more than 80% in the generation of free, excited fluorine atoms.

What is claimed is:

1. Device to generate excited and/or ionized particles in a plasma from a process gas with a generator (11) to generate an electromagnetic wave, an electric coaxial conductor (30) in which the electromagnetic wave is guided, and at least one plasma zone (20) in which the excited and/or ionized particles are formed by the electromagnetic wave, characterized in that an inlet (17) is available for inlet of the process gas into an interior chamber (31) of the coaxial conductor (30) between an outer conductor (18) and a displaceable inner conductor (19), and that the inner chamber forms the plasma zone (20).

2. Device according to claim 1, characterized in that the generator (11) is a magnetron to generate an electromagnetic wave.

3. Device according to claim 1, characterized in that the inner conductor (19) of the coaxial conductor (30) is manufactured from metal, from metal coated with oxide or quartz or from metallized oxide or quartz.

4. Device according claim 1, characterized in that the outer conductor (18) of the coaxial conductor (30) is manufactured from metal, metal coated with oxide or quartz, or from metallized oxide or quartz.

5. Device according to claim 1, characterized in that the inner conductor (19) and/or the outer conductor (18) of the coaxial conductor (30) are cooled by means of cooling.

6. Device according to claim 1, characterized in that the electromagnetic wave is guided by means of an impedance converter (12, 15) into the coaxial conductor (30).

7. Device according to claim 6, characterized in that the impedance converter (12, 15) is composed of a hollow waveguide (12) and impedance transformer cone (15).

8. Device according to claim 6, characterized in that between the generator (11) for the electromagnetic wave or the impedance converter (12, 15) and the plasma zone (20), there is a transport region (50) in which the electromagnetic wave is transported essentially without loss.

9. Device according to claim 8, characterized in that the transport region (50) is formed as a coaxial conductor.

10. Device according to claim 1, characterized in that the length of the plasma zone (20) is variable.

11. Device according to claim 1, characterized in that a magnetic system (40) is provided.

12. Device according to claim 11, characterized in that the magnetic system (40) is composed of at least one magnetic field coil (42) on the outside of the outer conductor (18).

13. Device according to claim 11, characterized in that the magnetic system (40) consists of magnetic rings (43) and/or pole shoe rings at the outside of the outer conductor (18).

14. Device according to claim 11, characterized in that the magnetic system (40) is composed of rod pole shoes or magnets (44) in the inner conductor (19).

15. Device according to one claim 1, characterized in that a sensor system is provided to monitor the plasma (25) in the plasma zone (20).

16. Device according to claim 1, characterized in that the inner conductor (19) and/or the outer conductor (18) of the coaxial conductor (30) are cooled by water cooling.

* * * * *

UNITED STATES PATENT AND TRADEMARK OFFICE
CERTIFICATE OF CORRECTION

PATENT NO. : 6,706,141 B1
APPLICATION NO. : 09/625200
DATED : March 16, 2004
INVENTOR(S) : Heinz Steinhardt et al.

It is certified that error appears in the above-identified patent and that said Letters Patent is hereby corrected as shown below:

Title page, item [57] Abstract, line 6 insert the word --coaxial-- between "a" and "conductor".

Signed and Sealed this

Twenty-second Day of January, 2008

JON W. DUDAS
*Director of the United States Patent and Trademark Office*